(12) United States Patent
Kito et al.

(10) Patent No.: US 7,737,041 B2
(45) Date of Patent: Jun. 15, 2010

(54) SEMICONDUCTOR DEVICE AND METHOD OF MANUFACTURING THE SAME

(75) Inventors: Masaru Kito, Yokohama (JP); Hideaki Aochi, Kawasaki (JP); Takayuki Okamura, Machida (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/059,280

(22) Filed: Mar. 31, 2008

(65) Prior Publication Data

US 2008/0246168 A1    Oct. 9, 2008

(30) Foreign Application Priority Data

Apr. 4, 2007    (JP) .............................. 2007-098227

(51) Int. Cl.
*H01L 21/302* (2006.01)
(52) U.S. Cl. ...................................... 438/705; 438/689
(58) Field of Classification Search ................. 438/689, 438/705
See application file for complete search history.

(56) References Cited

U.S. PATENT DOCUMENTS

| 5,953,611 | A | * | 9/1999 | Tanaka | 438/267 |
| 6,151,249 | A | | 11/2000 | Shirota et al. | |
| 7,253,118 | B2 | * | 8/2007 | Tran et al. | 438/717 |
| 2004/0253525 | A1 | * | 12/2004 | Kanai | 430/5 |
| 2006/0211260 | A1 | * | 9/2006 | Tran et al. | 438/763 |
| 2008/0017992 | A1 | | 1/2008 | Kito et al. | |
| 2008/0017996 | A1 | | 1/2008 | Sato et al. | |

FOREIGN PATENT DOCUMENTS

| JP | 2582412 | 11/1996 |
| JP | 11-176956 | 7/1999 |
| JP | 3207592 | 7/2001 |
| JP | 2006-303022 | 11/2006 |
| JP | 2007-305970 | 11/2007 |
| JP | 2008-27978 | 2/2008 |

* cited by examiner

*Primary Examiner*—Bradley K Smith
*Assistant Examiner*—Marvin Payen
(74) *Attorney, Agent, or Firm*—Oblon, Spivak, McClelland, Maier & Neustadt, L.L.P.

(57) ABSTRACT

A semiconductor device comprises a semiconductor layer including a plurality of paralleled linear straight sections extending in a first direction. The layer also includes a plurality of connecting sections each having a width in the first direction sufficient to form a wire-connectable contact therein and arranged to connect between adjacent ones of the straight sections in a second direction. The connecting sections have respective ends formed aligned with a first straight line parallel to the second direction.

12 Claims, 17 Drawing Sheets

A-A' Section

B-B' Section

A-A' Section

B-B' Section

A-A' Section

B-B' Section

A-A' Section

B-B' Section

A-A' Section

B-B' Section

A-A' Section

B-B' Section

A-A' Section

B-B' Section

A-A' Section

B-B' Section

A-A' Section

B-B' Section

A-A' Section

B-B' Section

A-A' Section

B-B' Section

A-A' Section

B-B' Section

A-A' Section

B-B' Section

A-A' Section

B-B' Section

A-A' 断面

B-B' Section

A-A' Section

B-B' Section

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2007-98227, filed on Apr. 4, 2007, the entire contents of which are incorporated herein by reference.

BACKGROUND OF THE INVENTION

1. Field of the Invention

The present invention relates to a semiconductor device and method of manufacturing the same. In particular, it relates to a semiconductor device and method of manufacturing the same using the so-called sidewall transfer process to etch an etching target member.

2. Description of the Related Art

In a semiconductor manufacturing process to form a wiring pattern (line-and-space), generally, a photolithography mask is used to develop a resist to transfer the pattern to the resist, which is then used as a mask to etch an etching target member.

As semiconductor devices have been fine-patterned in recent years, EEPROMs with a reduced number of bit lines and drain contacts have been proposed (see, for example, Patent Document 1: JP 2-74069A). Associated with the reduced number of bit lines and drain contacts, there are technologies for solving the problem about injection of electrons (failed write) due to occurrences of electron-hole pairs in a Si substrate (see, for example, Patent Document 2: JP 6-275800A).

The technologies as in the above Patent Documents 1, 2 require a semiconductor device that allows a common contact to be formed in a set of two source/drain diffusion layer portions (semiconductor layer portions). Such the common contact-formable semiconductor device is structured to have H-shaped source/drain diffusion layer portions partly connected seen from above.

Formation of the above H-shaped source/drain diffusion layer portions leaves a problem associated with the lithography resolution limit caused in accordance with downsizing of semiconductor devices. Specifically, if a contact fringe is formed in a portion of source/drain diffusion layer portions aligned at a smallest pitch, the interval between contact fringes in adjacent source/drain diffusion layer portions can not be formed by the lithography at a sufficient resolution. In this case, the interval becomes narrow, which may establish a short circuit possibly. An etching also can not form the interval. In a word, the above problem lowers the yield as well.

In the method of forming a contact at the center of two diffusion layer portions as disclosed in the Patent Document 2, the contact area between the source/drain diffusion layer portion and the contact is small. Therefore, it causes an increase in contact resistance as a problem. If the contact is shifted to one side by misalignment or the like, an open failure may arise.

On the other hand, there is a technology for forming a pattern below the lithography resolution limit using the so-called sidewall transfer process. The use of this technology to form source/drain diffusion layer portions and form a contact fringe spanning two source-drain diffusion layer portions, however, additionally requires a lithography step and an etching step. Further, as for lithography, the problem about the narrow space associated with an adjacent pattern and the problem about the misalignment with the source/drain diffusion layer portions may occur similarly as can be predicted.

SUMMARY OF THE INVENTION

In one aspect the present invention provides a method of manufacturing a semiconductor device including a first region formed of a plurality of paralleled semiconductor layer portions extending linearly in a first direction and a second region formed of two adjacent ones of the semiconductor layer portions connected in a second direction, the method comprising: forming a first hard mask on an etching target member; forming on the first hard mask a second hard mask having paralleled portions extending straight in the first direction at plural locations; executing ion implantation into the second hard mask in the second region while protecting the first region from the ion implantation with a mask, thereby reforming the second region for changing an etching rate for wet etching in the second region from that in the first region; etching the first hard mask with a mask of the second hard mask; removing the second hard mask from the first region selectively by wet etching while leaving the second hard mask in the second region; forming sidewall films on sidewalls of the first hard mask; etching off the first hard mask selectively to remove a portion thereof having an upper part not covered with the second hard mask but exposed in the first region; and etching off the etching target member with a mask of the sidewall films and the first hard mask.

In one aspect the present invention provides a semiconductor device, comprising: a semiconductor layer including a plurality of paralleled linear straight sections extending in a first direction and a plurality of connecting sections each having a width in the first direction sufficient to form a wire-connectable contact therein and arranged to connect between adjacent ones of the straight sections in a second direction, wherein the connecting sections have respective ends formed aligned with a first straight line parallel to the second direction.

DETAILED DESCRIPTION OF THE EMBODIMENTS

The embodiments of the present invention will now be described in detail with reference to the drawings.

Figure 1:
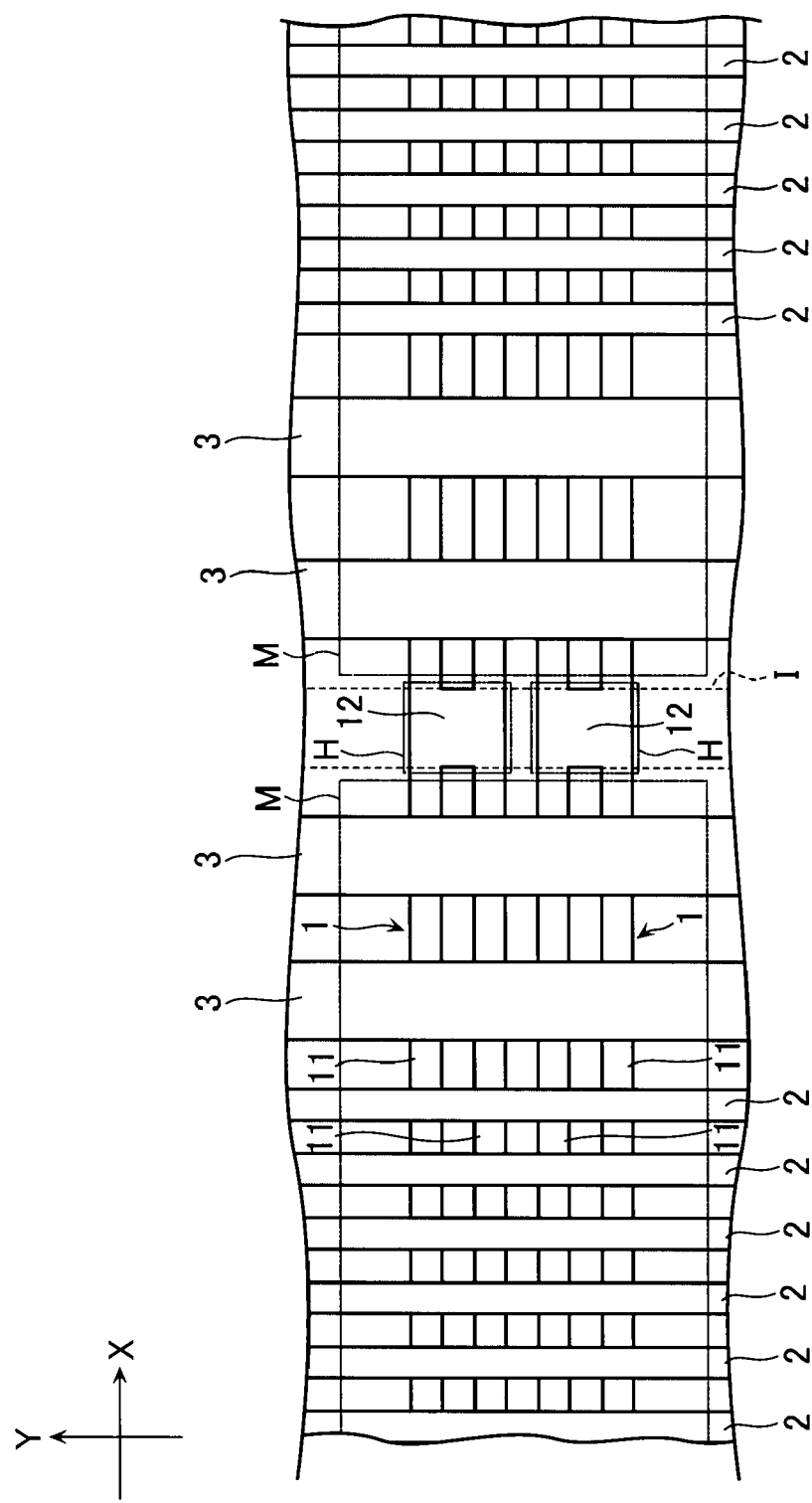
FIG. 1 shows a semiconductor device according to an embodiment of the present invention.

A structure of a semiconductor device according to an embodiment of the present invention is described with reference to FIG. 1. As shown in FIG. 1, the semiconductor device according to the embodiment includes plural source/drain diffusion layer portions 1 linearly extending in the X-axis direction on a semiconductor substrate; word lines 2 extending over the source/drain diffusion layer portions 1 in the Y-axis direction (a direction orthogonal to the X-axis direction); and selection gate lines 3 extending over the source/drain diffusion layer portions 1 in the Y-axis direction.

The source/drain diffusion layer portion 1 is formed in an H-shape. Each source/drain diffusion layer portion 1 includes two straight sections 11 extending parallel in the X-axis direction and a connecting section 12 extending in the Y-axis direction to connect between adjacent straight sections 11. In the semiconductor device according to the present embodiment, the location of forming the straight sections 11 serves as a memory cell array region M. In addition, the location of forming the connecting section 12 serves as a fringe region H for connecting the source/drain diffusion layer portions 1 to a bit line (not shown). The connecting section 12 has a width in the X-axis direction, which is a bit line contact-formable width. All ends in the X-axis direction are formed in parallel with the Y-axis direction and aligned with a straight line. The connecting section 12 has a width in the Y-axis direction, which is formed wider than the straight section 11.

In the semiconductor device shown in FIG. 1, the straight sections 11 are formed as derived from linear sidewall films along sidewalls of a hard mask formed in parallel as described later. The connecting section 12 is formed after mask formation through a step of implanting impurity ions into a hard mask in a rectangular ion implantation region I aligned with the connecting section 12. The connecting section 12 is formed as derived from the hard mask and sidewall films. The hard mask is provided with an etching rate for wet etching different from that in the straight section 11 through the step of ion implanting. The ion implantation region I has the same width as the width of the connecting section 12 in the X-axis direction. Namely, the width of the connecting section 12 in the X-axis direction is based on boundaries of masks formed in other regions than the ion implantation region I and of the hard mask.

A method of manufacturing the semiconductor device according to the embodiment of the present invention is described next with reference to FIGS. 2A (2B, 2C) through 15A (15B, 15C). FIGS. 2A-15A are top views of the semiconductor device in manufacturing steps. FIGS. 2B-15B are cross-sectional views taken along A-A' of FIGS. 2A-15A. FIGS. 2C-15C are cross-sectional views taken along B-B' of FIGS. 2A-15A. In the following example, a silicon nitride film (SiN) 50 formed on a pad oxide film 42 on a semiconductor substrate 41 is etched as an etching target member. In the memory cell array region M, with the use of the sidewall transfer process, the straight sections 11 in the source/drain diffusion layer portion 1 below the lithography resolution limit are formed of the silicon nitride 50. In the fringe region H, the connecting section 12 is formed of the silicon nitride 50 at the same time with an arbitrary width for connecting between the straight sections 11 in the source/drain diffusion layer portion 1.

Figure 2A:
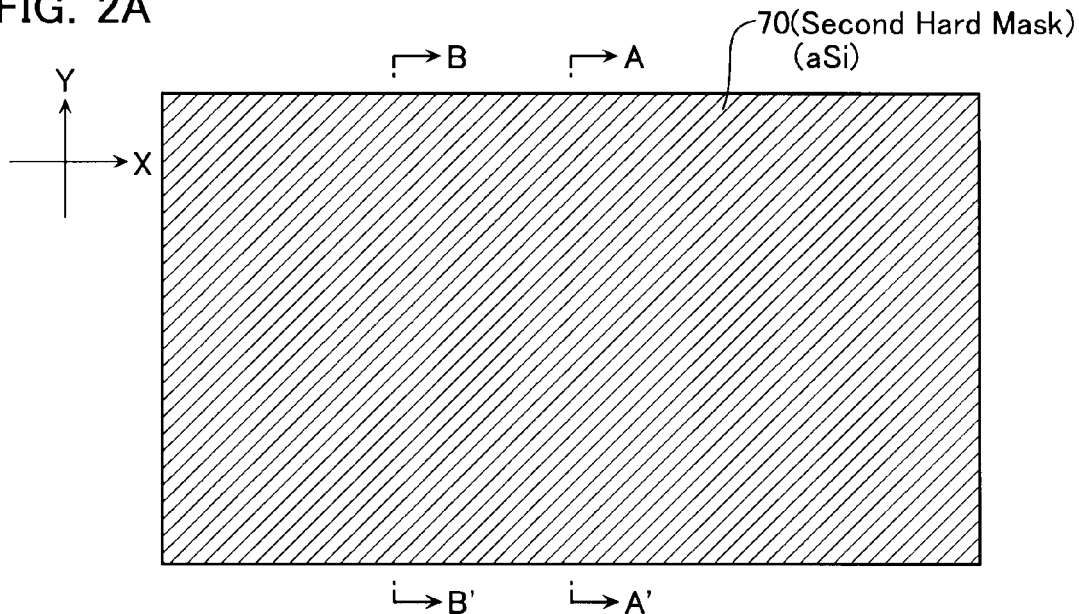
FIG. 2A shows a step in a method of manufacturing the semiconductor device according to the embodiment of the present invention.
Figure 2B:
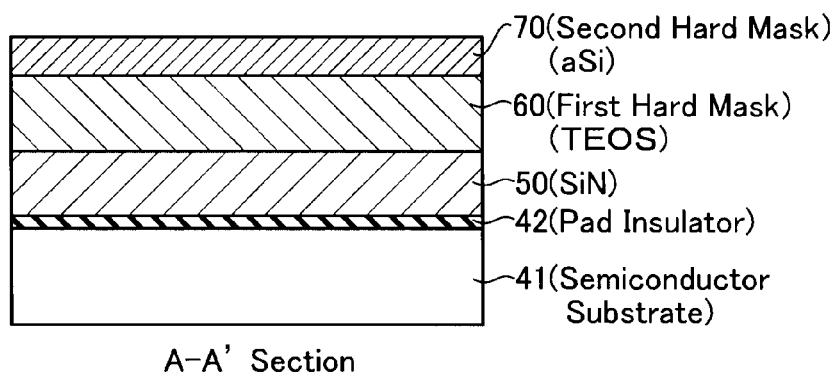
FIG. 2B shows a step in the method of manufacturing the semiconductor device according to the embodiment of the present invention.
Figure 2C:
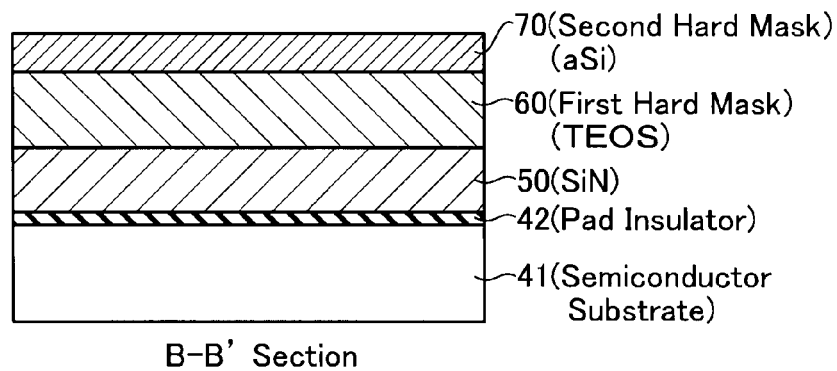
FIG. 2C shows a step in the method of manufacturing the semiconductor device according to the embodiment of the present invention.

First, as shown in FIGS. 2A-2C, a first hard mask 60 composed of TEOS (Tetra Ethyl Ortho Silicate) for use in etching the etching target member or the silicon nitride 50 is deposited thereon. This is just an example and the first hard mask 60 in various types (the number of layers, the thickness of each layer, the material and so forth) may be used in consideration of etching conditions and mask materials.

The first hard mask 60 serves as a sidewall formation material for forming sidewalls 80 as described later. A second hard mask 70 composed of amorphous silicon is further formed on the first hard mask 60. The second hard mask 70 is formed to etch the first hard mask 60 composed of TEOS into a desired pattern. The second hard mask 70 may also be composed of a material that changes the etching rate for wet etching on receipt of ion implantation, such as polysilicon, instead of amorphous silicon.

Figure 3A:
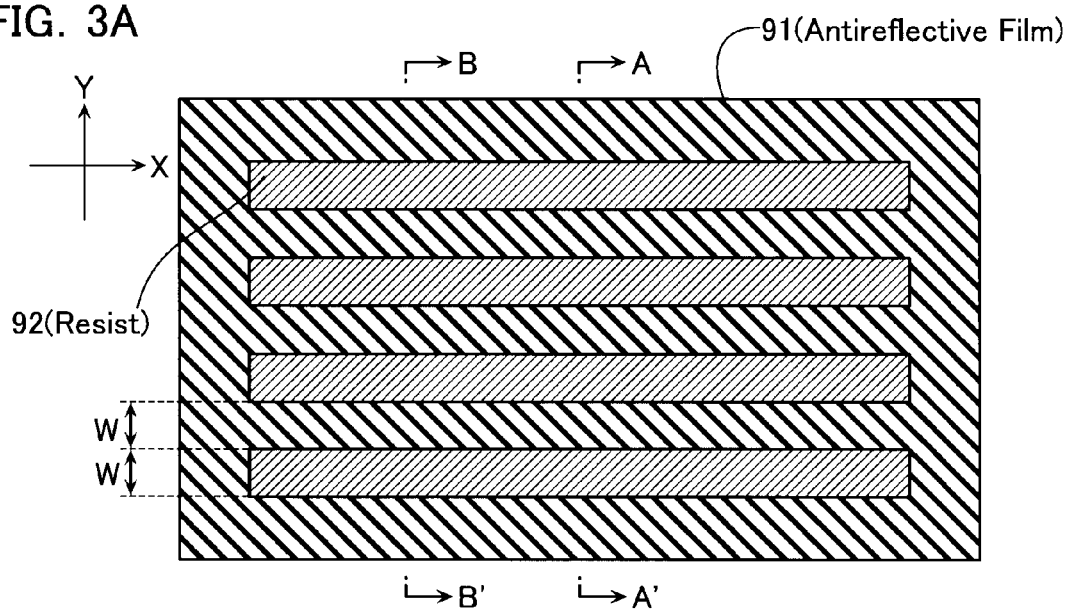
FIG. 3A shows a step in the method of manufacturing the semiconductor device according to the embodiment of the present invention.
Figure 3B:
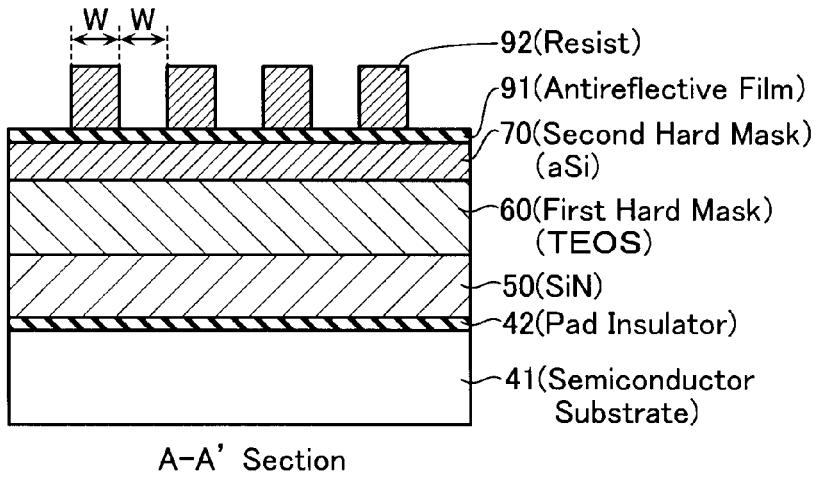
FIG. 3B shows a step in the method of manufacturing the semiconductor device according to the embodiment of the present invention.
Figure 3C:
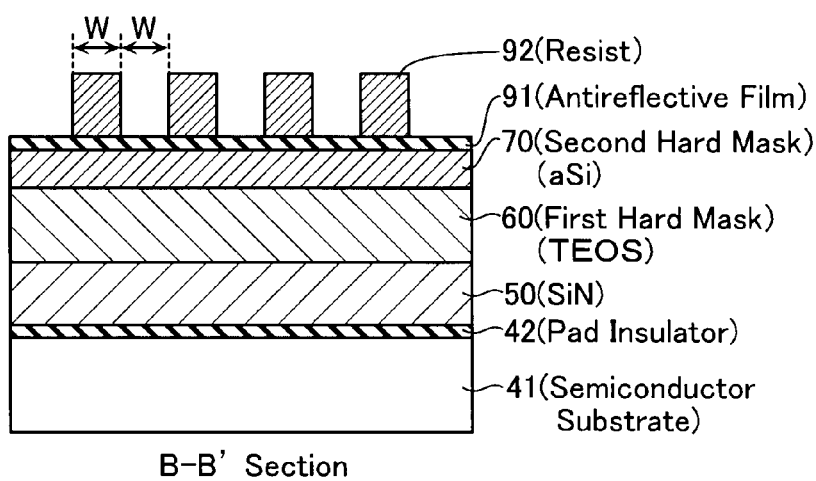
FIG. 3C shows a step in the method of manufacturing the semiconductor device according to the embodiment of the present invention.

Next, as shown in FIGS. 3A-3C, an antireflective film 91 is applied over the entire second hard mask 70 and then a resist is applied on the upper surface of the antireflective film 91. Thereafter, a lithography method is used to develop the resist to form a resist 92 having a desired pattern form. The resist 92 has plural paralleled rectangular pattern forms extending in the X-axis direction. The resist 92 has a line-and-space of the minimum line width W, and the width W of the lines is almost equal to that of the spaces. The minimum line width W herein means a width determined from the lithography resolution limit.

Figure 4A:
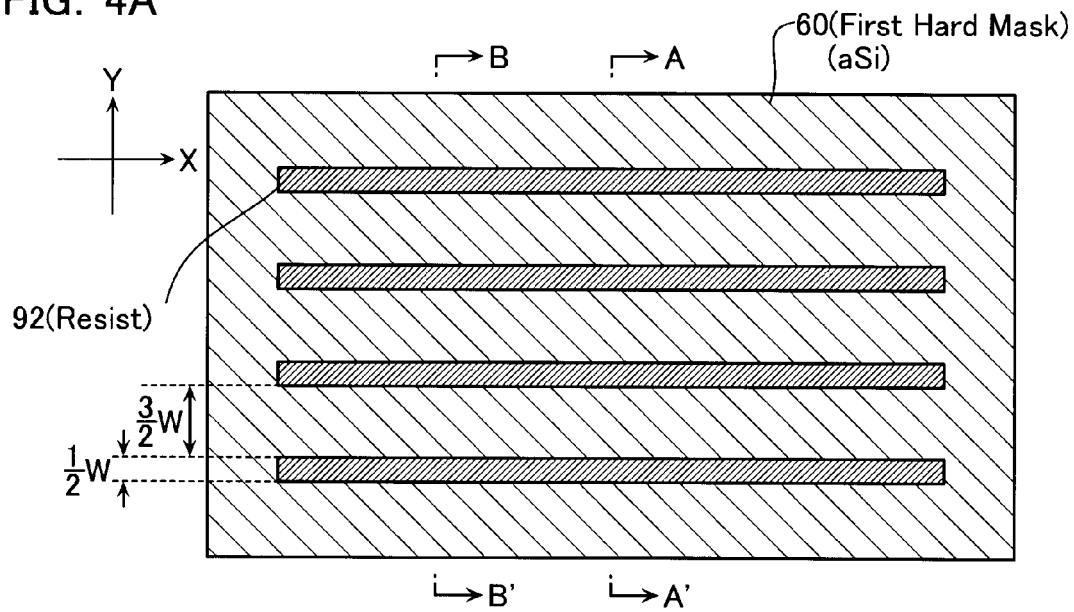
FIG. 4A shows a step in the method of manufacturing the semiconductor device according to the embodiment of the present invention.
Figure 4B:
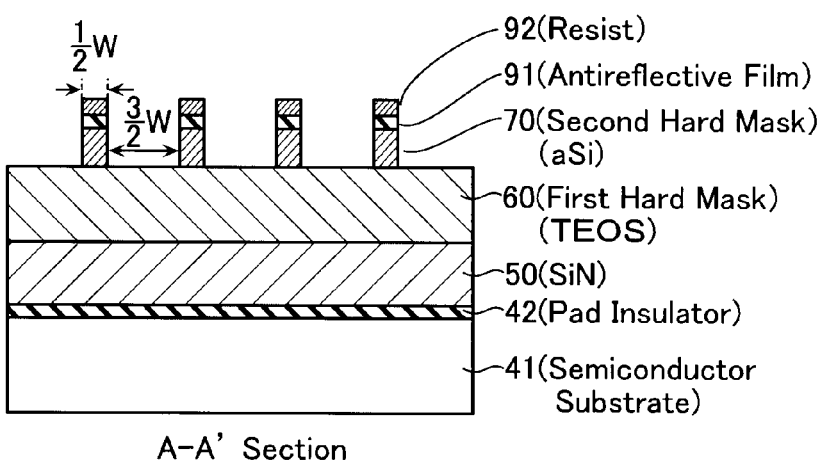
FIG. 4B shows a step in the method of manufacturing the semiconductor device according to the embodiment of the present invention.
Figure 4C:
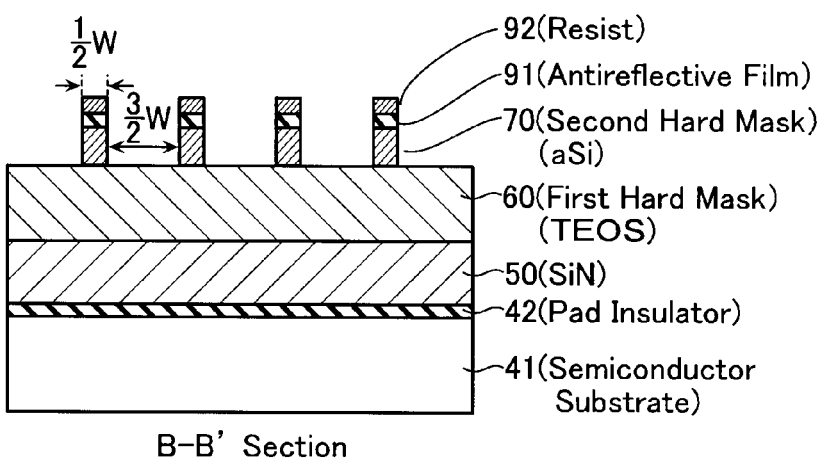
FIG. 4C shows a step in the method of manufacturing the semiconductor device according to the embodiment of the present invention.
Figure 5A:
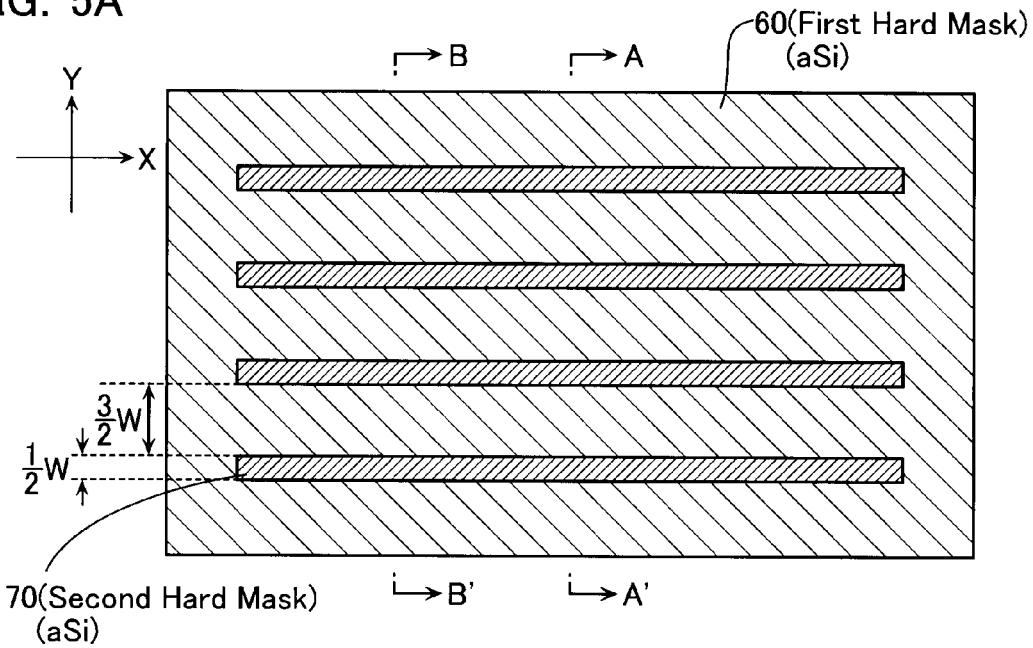
FIG. 5A shows a step in the method of manufacturing the semiconductor device according to the embodiment of the present invention.
Figure 5B:
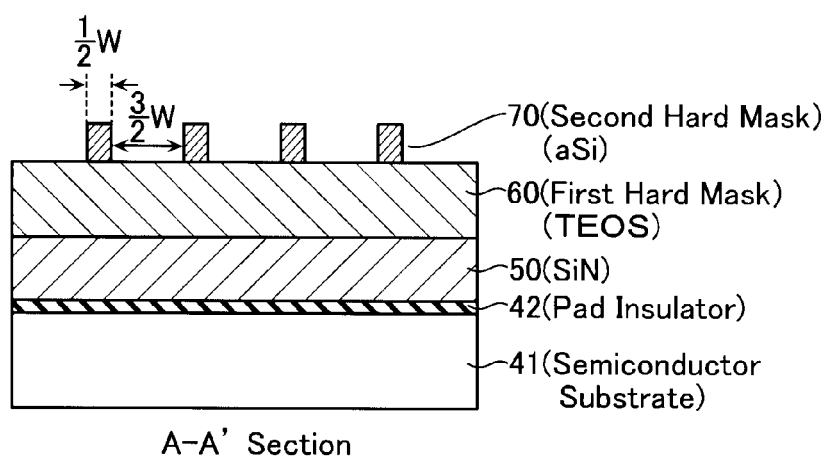
FIG. 5B shows a step in the method of manufacturing the semiconductor device according to the embodiment of the present invention.
Figure 5C:
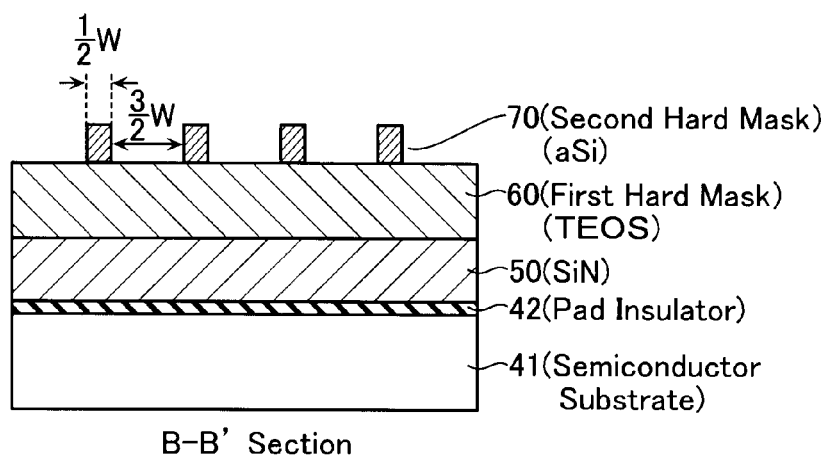
FIG. 5C shows a step in the method of manufacturing the semiconductor device according to the embodiment of the present invention.

Next, as shown in FIGS. 4A-4C, an anisotropic etching is used to etch the antireflective film 91 and slim the resist 92 at the same time to bring the resist 92 to a slimmed width below the resolution limit of photolithography. Then, an anisotropic etching with a mask of the slimmed resist 92 is used to etch the second hard mask 70. In a word, plural paralleled portions extending in the X-axis direction are formed in the second hard mask 70. After the etching, the antireflective film 91 and the resist 92 are peeled off as shown in FIGS. 5A-5C. The resist 92 is herein controlled to have a line width of ½W and a space width of 3/2W.

Figure 6A:
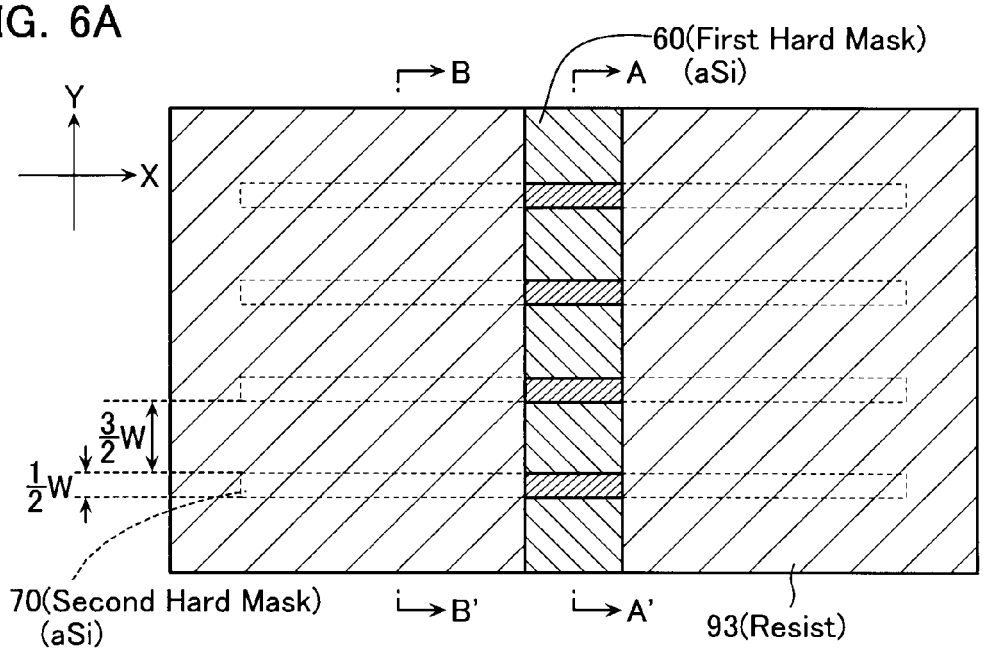
FIG. 6A shows a step in the method of manufacturing the semiconductor device according to the embodiment of the present invention.
Figure 6B:
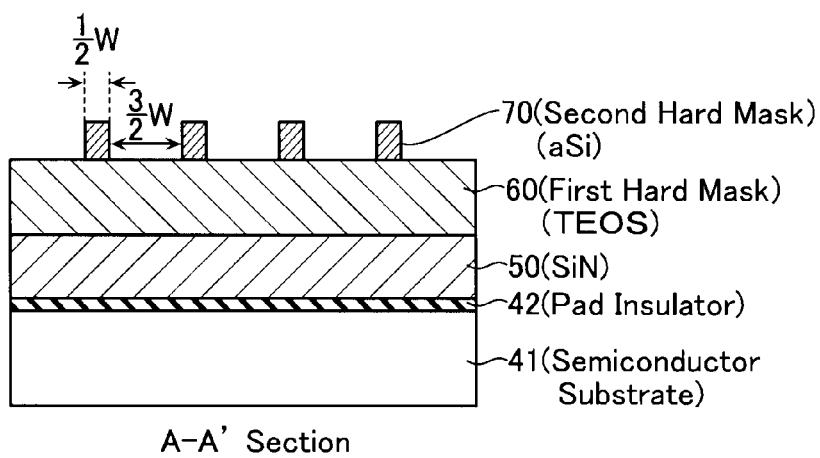
FIG. 6B shows a step in the method of manufacturing the semiconductor device according to the embodiment of the present invention.
Figure 6C:
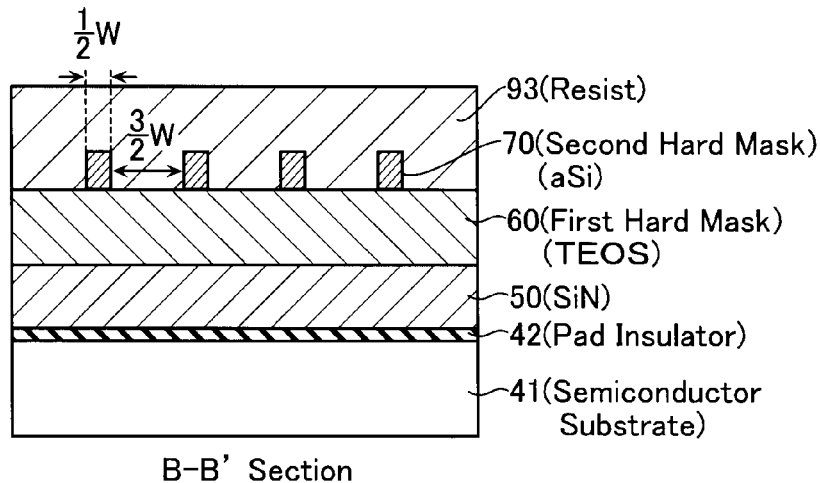
FIG. 6C shows a step in the method of manufacturing the semiconductor device according to the embodiment of the present invention.

Then, as shown in FIGS. 6A-6C, a resist 93 is formed on the second hard mask 70 only in regions (the memory cell array regions M in this example) desired to form line-and-space patterns therein below the lithography resolution limit through the sidewall transfer process.

Figure 7A:
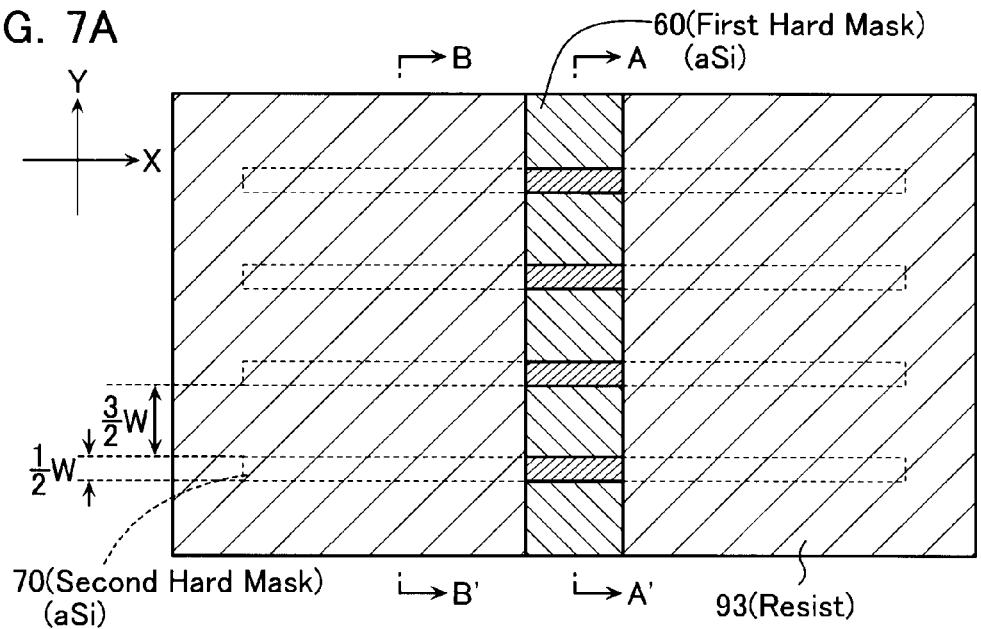
FIG. 7A shows a step in the method of manufacturing the semiconductor device according to the embodiment of the present invention.
Figure 7B:
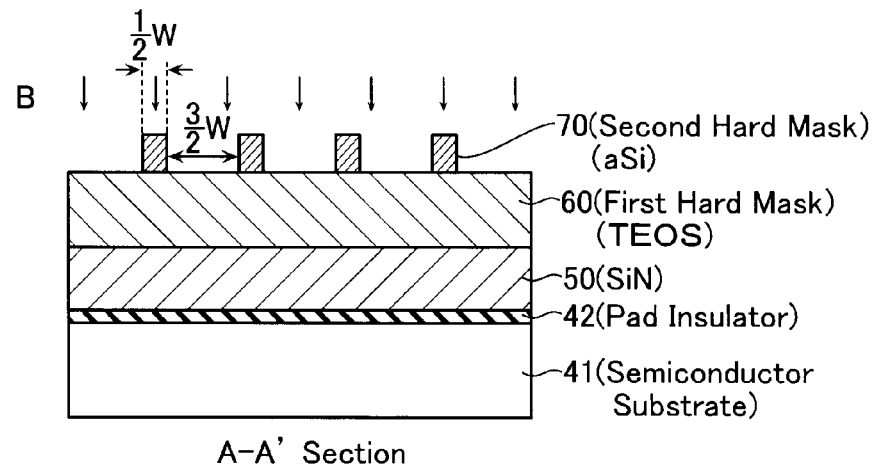
FIG. 7B shows a step in the method of manufacturing the semiconductor device according to the embodiment of the present invention.
Figure 7C:
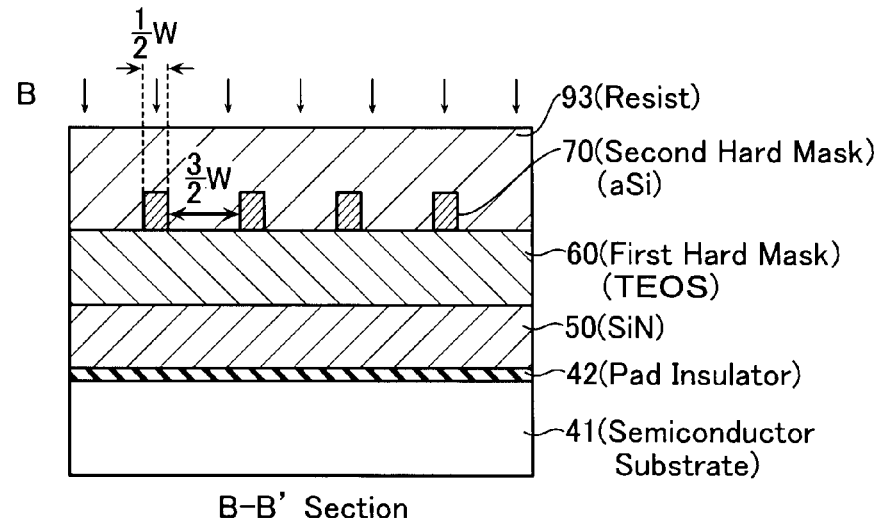
FIG. 7C shows a step in the method of manufacturing the semiconductor device according to the embodiment of the present invention.

Subsequently, as shown in FIGS. 7A-7C, with the use of the resist 93 as a mask, impurity ions (preferably, boron (B), phosphorous (P), arsenic (As) and boron difluoride ($BF_2$)) are implanted into the second hard mask 70. In an example, the ion implantation condition is adjusted such that the ion-implanted second hard mask 70B has an impurity concentration of $1 \times 10^{20}$ cm$^{-3}$. The ion-implanted second hard mask 70B not covered with the resist 93 is lower in etching rate for wet etching with an alkaline solution than the second hard mask 70 covered with the resist 93 and not ion-implanted.

Figure 8A:
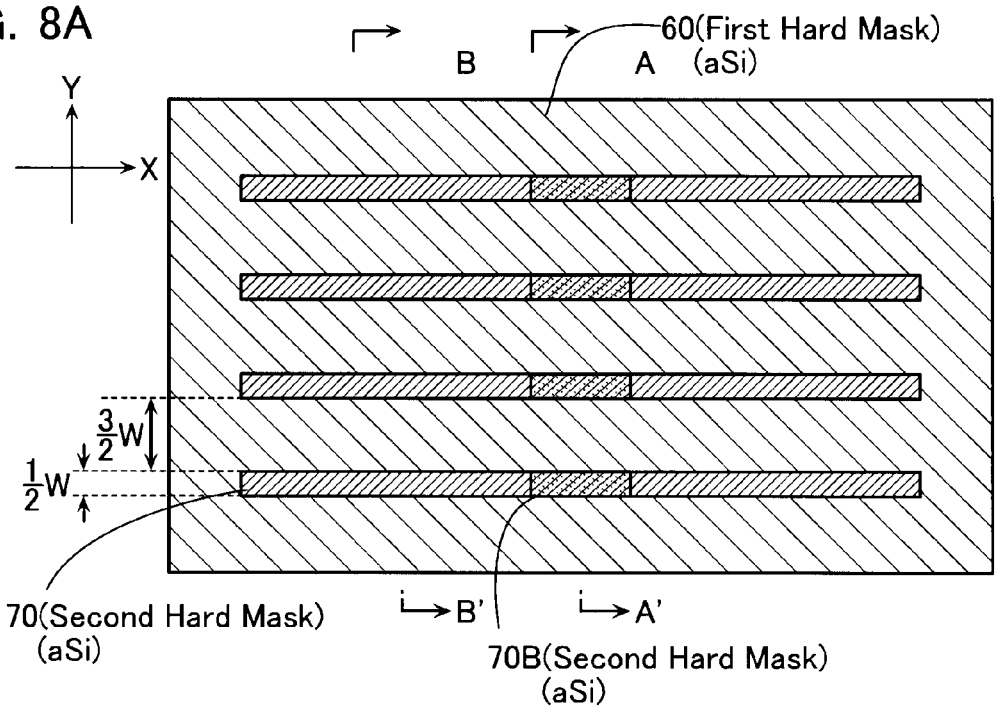
FIG. 8A shows a step in the method of manufacturing the semiconductor device according to the embodiment of the present invention.
Figure 8B:
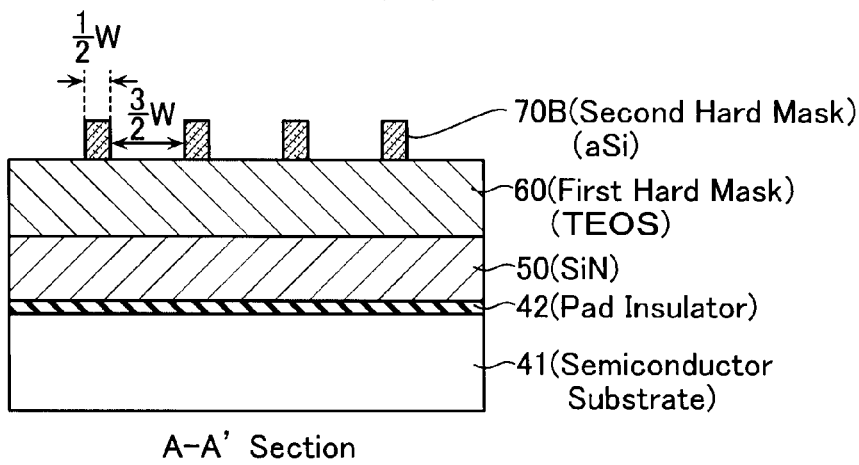
FIG. 8B shows a step in the method of manufacturing the semiconductor device according to the embodiment of the present invention.
Figure 8C:
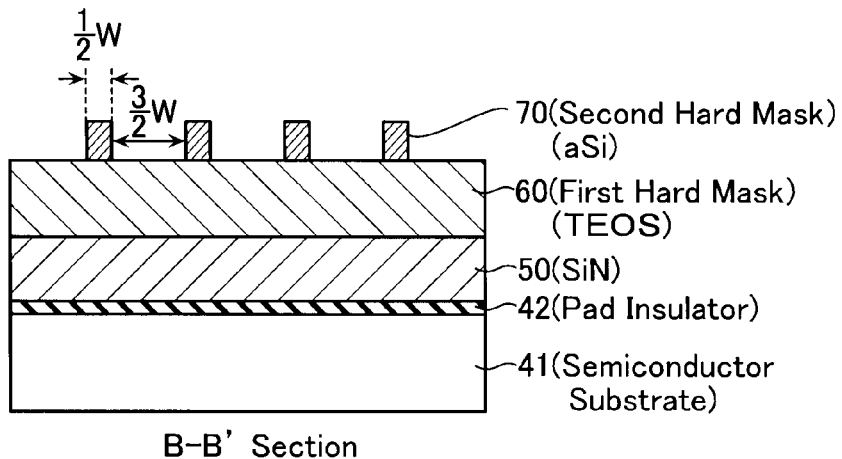
FIG. 8C shows a step in the method of manufacturing the semiconductor device according to the embodiment of the present invention.
Figure 9A:
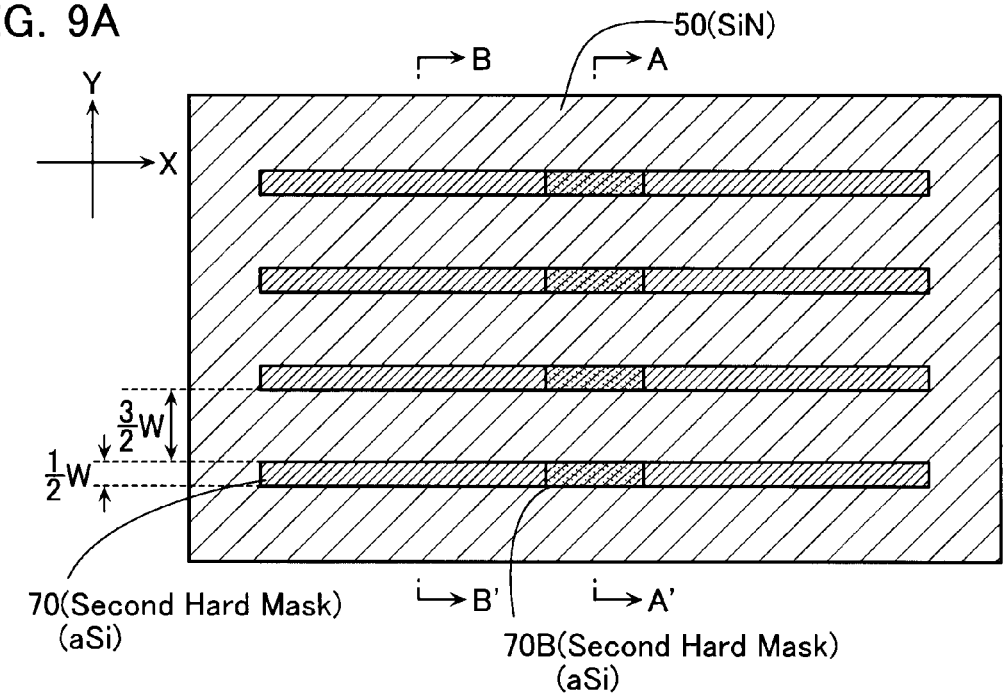
FIG. 9A shows a step in the method of manufacturing the semiconductor device according to the embodiment of the present invention.
Figure 9B:
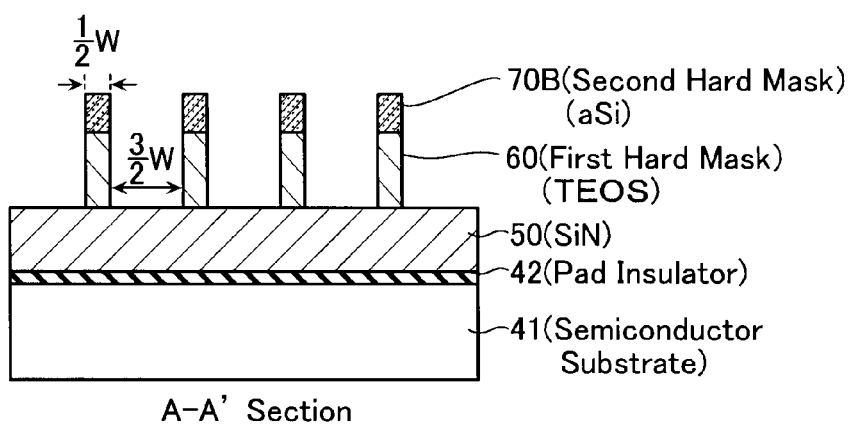
FIG. 9B shows a step in the method of manufacturing the semiconductor device according to the embodiment of the present invention.
Figure 9C:
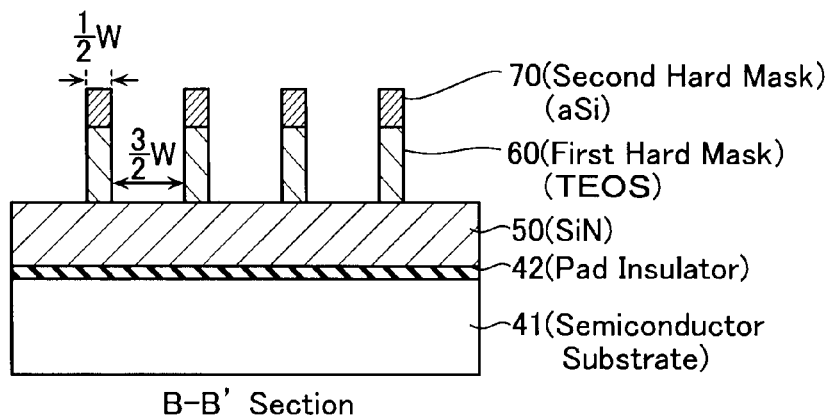
FIG. 9C shows a step in the method of manufacturing the semiconductor device according to the embodiment of the present invention.

Subsequently, after the resist 93 is peeled off as shown in FIGS. 8A-8C, an anisotropic etching with a mask of the second hard masks 70, 70B is used to etch the first hard mask 60 serving as a sidewall formation material as shown in FIGS. 9A-9C.

Figure 10A:
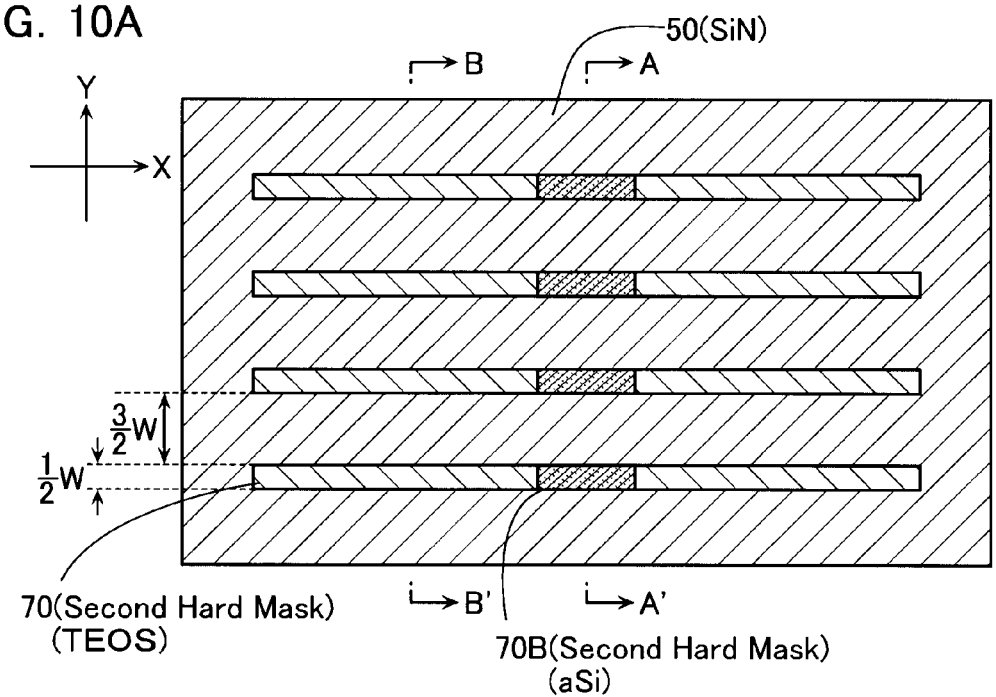
FIG. 10A shows a step in the method of manufacturing the semiconductor device according to the embodiment of the present invention.
Figure 10B:
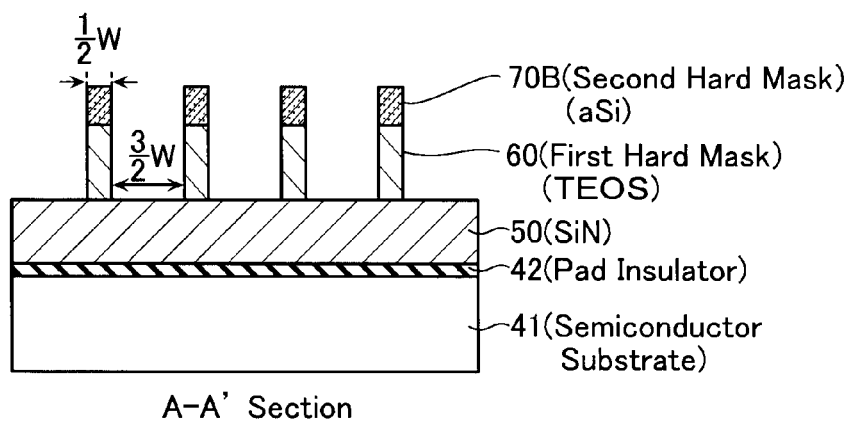
FIG. 10B shows a step in the method of manufacturing the semiconductor device according to the embodiment of the present invention.
Figure 10C:
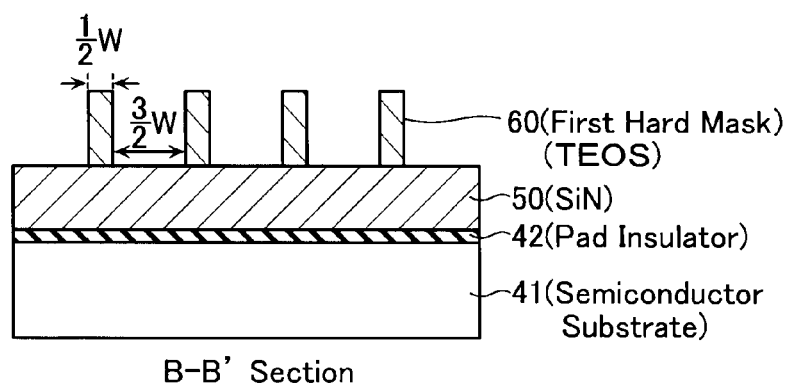
FIG. 10C shows a step in the method of manufacturing the semiconductor device according to the embodiment of the present invention.

Thereafter, as shown in FIGS. 10A-10C, a wet etching with an alkaline solution is applied to remove the never-ion-implanted second hard mask 70 selectively and leave the ion-implanted second hard mask 70B. The alkaline solution-used wet etching also etches the oxide and nitride films at a higher selection ratio. Accordingly, it exerts no ill effect on the first hard mask 60 serving as the sidewall formation material and the silicon nitride 50 in the underlying layer (the etching target material). This method makes it possible to remove only the second hard mask 70 in the memory cell array region M with ease and without exerting any side-effect on others.

Figure 11A:
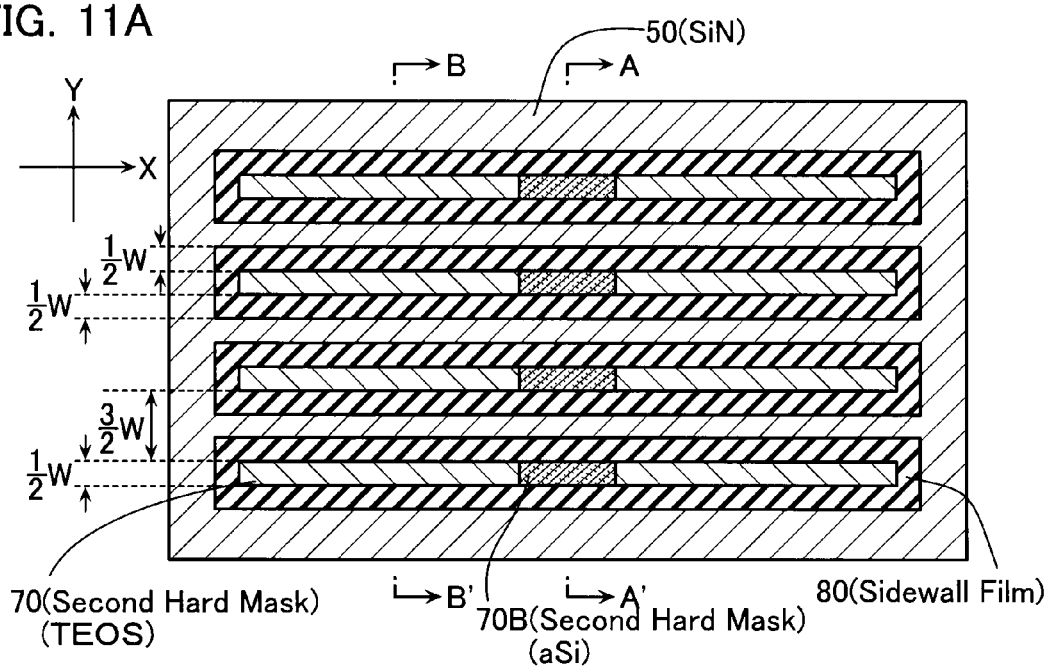
FIG. 11A shows a step in the method of manufacturing the semiconductor device according to the embodiment of the present invention.
Figure 11B:
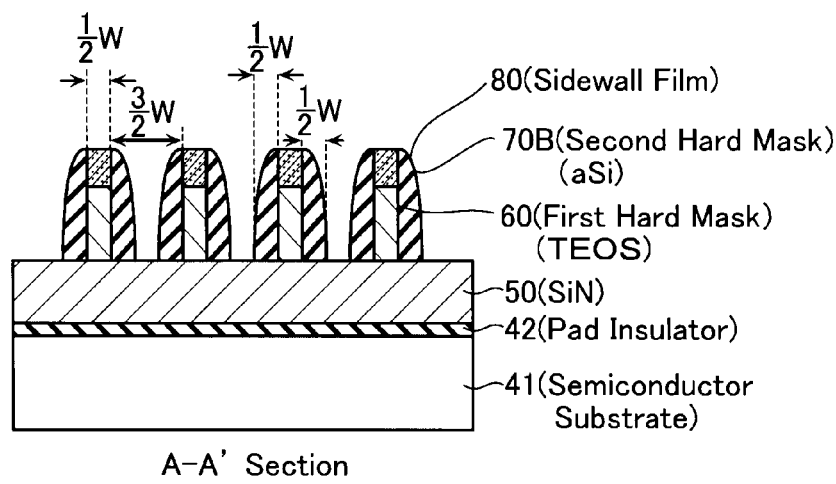
FIG. 11B shows a step in the method of manufacturing the semiconductor device according to the embodiment of the present invention.
Figure 11C:
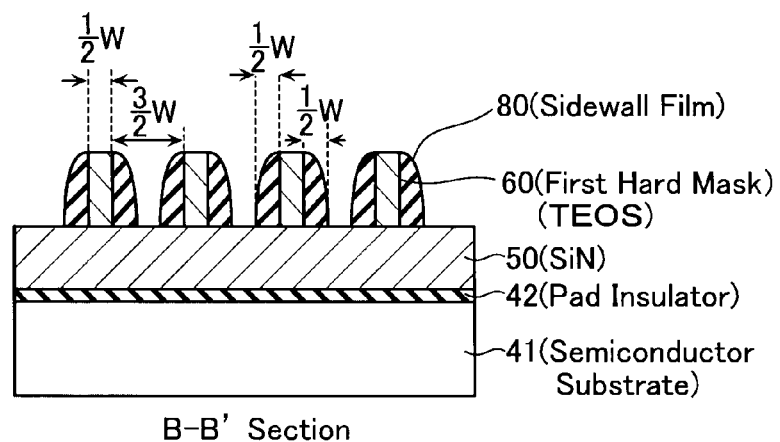
FIG. 11C shows a step in the method of manufacturing the semiconductor device according to the embodiment of the present invention.
Figure 12A:
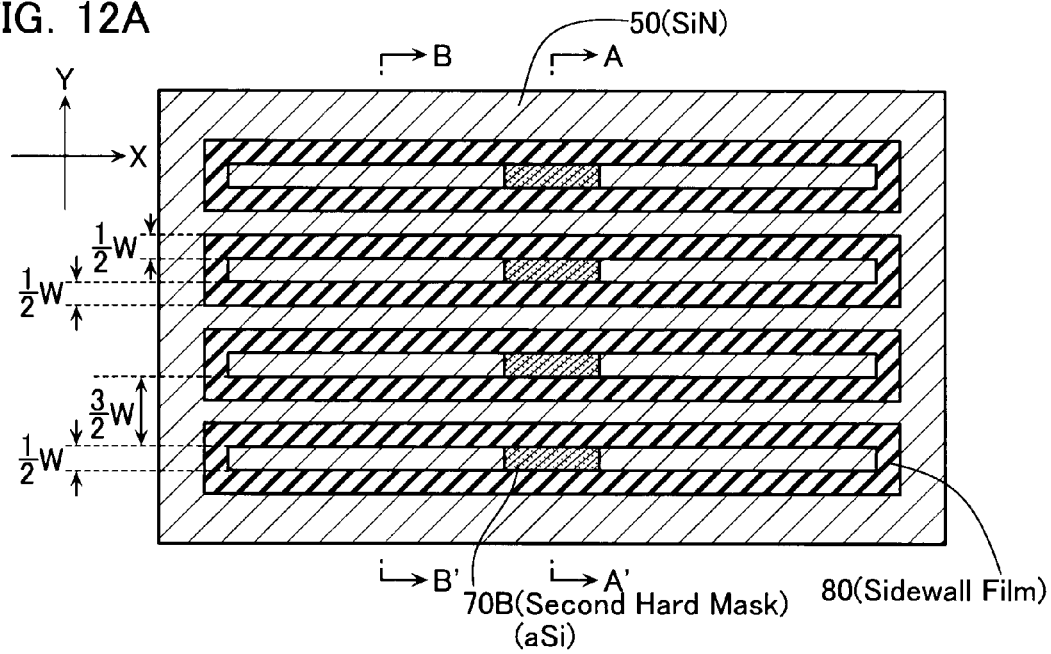
FIG. 12A shows a step in the method of manufacturing the semiconductor device according to the embodiment of the present invention.
Figure 12B:
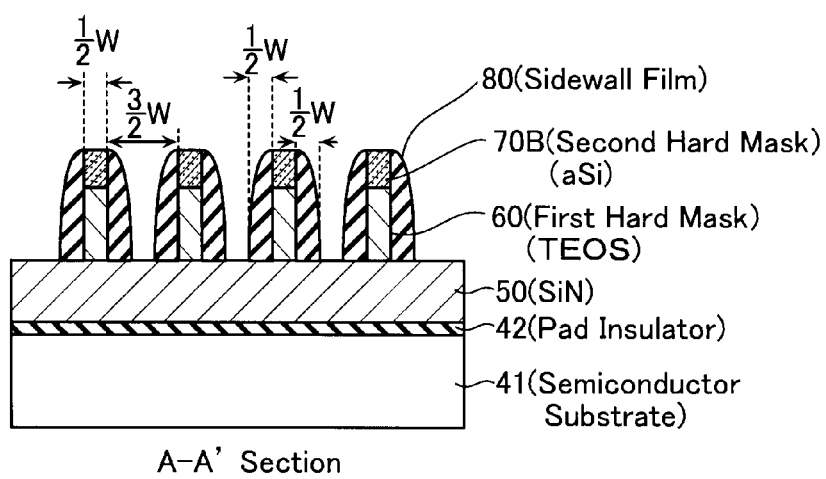
FIG. 12B shows a step in the method of manufacturing the semiconductor device according to the embodiment of the present invention.
Figure 12C:
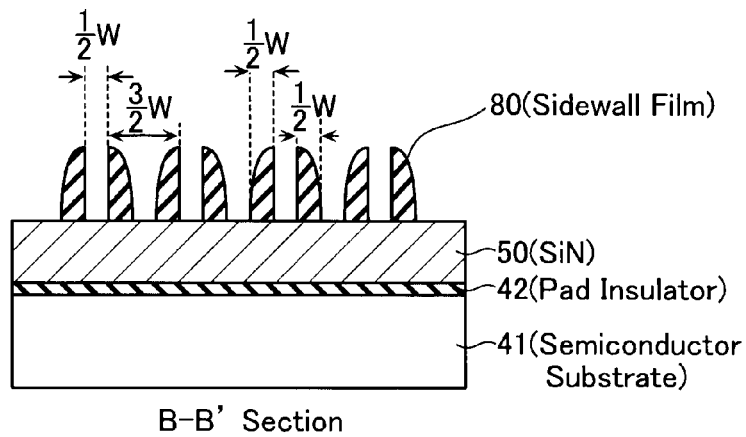
FIG. 12C shows a step in the method of manufacturing the semiconductor device according to the embodiment of the present invention.

Thereafter, as shown in FIGS. 11A-11C, a CVD method is applied to deposit an amorphous silicon film over the entire first hard mask 60 including the upper surface of the second hard mask 70B. Then, an anisotropic etching is used to etch the amorphous silicon film so as to remain only on the sidewalls of the first hard mask 60 and on the sidewalls of the second hard mask 70B. The remaining films are used as sidewall films 80 (amorphous silicon films). The sidewall films 80 are desired to reach the upper part of the sidewalls of the second hard mask 70B to prevent the first hard mask 60 from being etched in the next step (FIGS. 12A-12C). The first hard mask 60 is etched to a width of around ½W, or one-half of the minimum line width W in accordance with the resolution limit. Therefore, the thickness of the deposited amorphous silicon, the etching condition and so forth are set such that the sidewall films 80 have a width of around ½W.

Subsequently, as shown in FIGS. 12A-12C, a wet etching with, for example, a dilute hydrofluoric acid is used to etch off the first hard mask 60 sandwiched between the sidewall films 80 and having exposed upper parts in the memory cell array region M. On the other hand, the first hard mask 60 covered with the second hard mask 70B in the fringe region H is not etched and remains. As a result, in the memory cell array region M, only the ½W-wide sidewall films 80 remain on the silicon nitride 50 at a space width of ½W. An etching with a mask of only such the sidewall films 80 can form a pattern of the semiconductor layer with a line width of ½W and a space width of ½W below the lithography resolution limit in the memory cell array region M. On the other hand, in the hinge region H, the first hard mask 60 covered with the second hard mask 70B and the sidewall films 80 is not etched and remains, and is used as an etching mask together with the sidewall films 80.

Figure 13A:
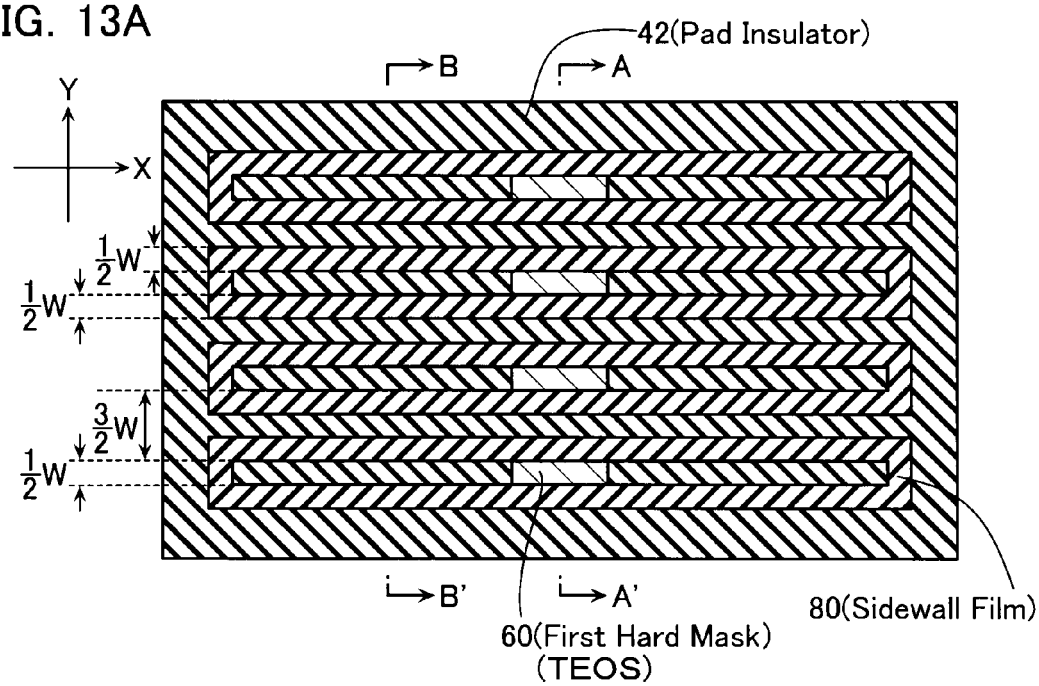
FIG. 13A shows a step in the method of manufacturing the semiconductor device according to the embodiment of the present invention.
Figure 13B:
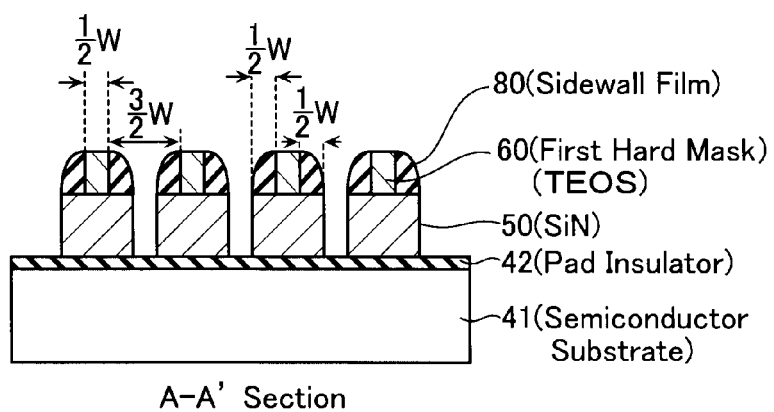
FIG. 13B shows a step in the method of manufacturing the semiconductor device according to the embodiment of the present invention.
Figure 13C:
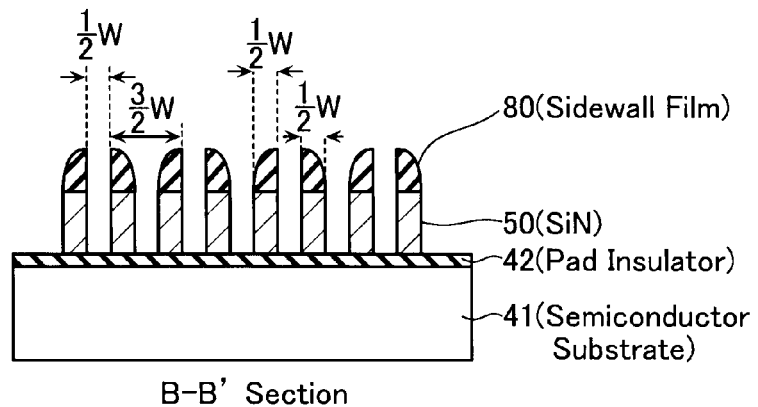
FIG. 13C shows a step in the method of manufacturing the semiconductor device according to the embodiment of the present invention.

Thereafter, as shown in FIGS. 13A-13C, an anisotropic etching with a mask of the sidewall films 80 composed of amorphous silicon and the second hard mask 70B similarly composed of amorphous silicon is applied to etch the silicon nitride 50. Preferably, the second hard mask 70B is set to have such a thickness that the second hard mask 70B can be etched off completely.

Figure 14A:
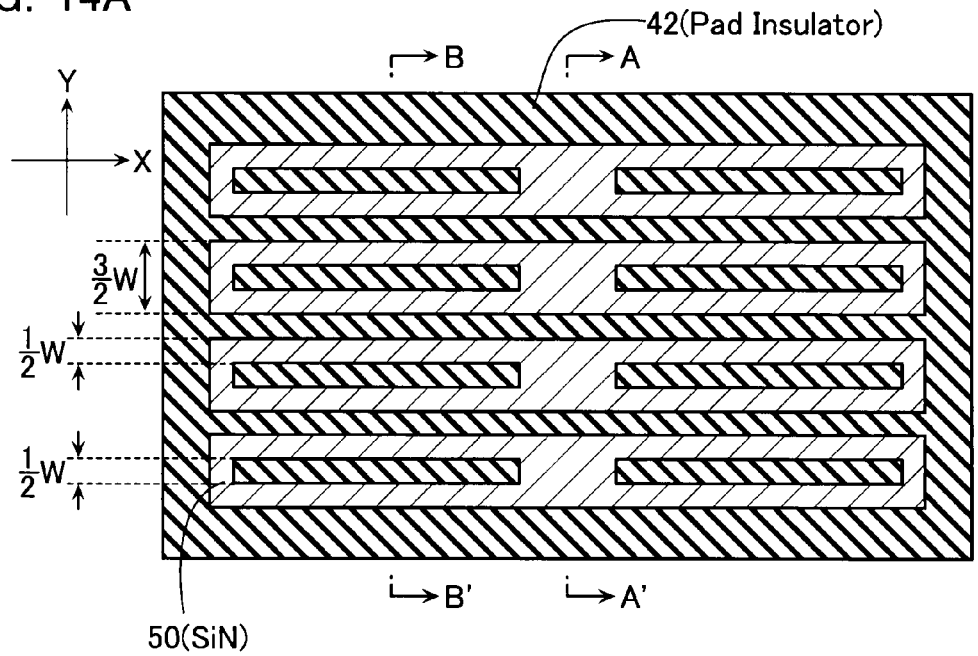
FIG. 14A shows a step in the method of manufacturing the semiconductor device according to the embodiment of the present invention.
Figure 14B:
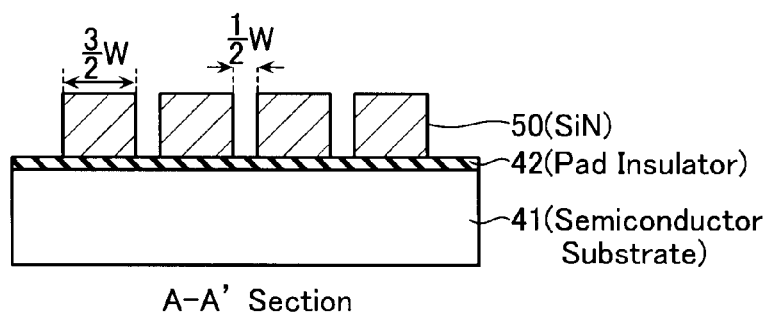
FIG. 14B shows a step in the method of manufacturing the semiconductor device according to the embodiment of the present invention.
Figure 14C:
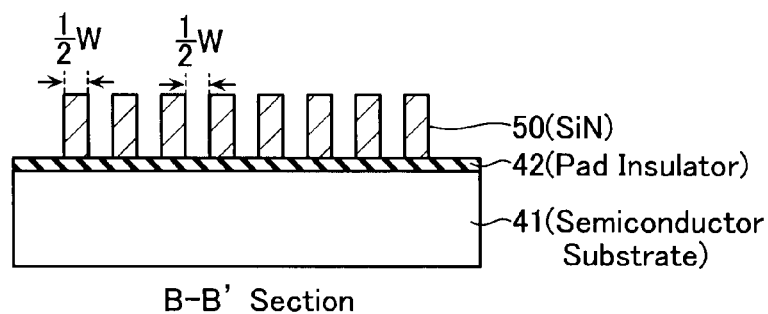
FIG. 14C shows a step in the method of manufacturing the semiconductor device according to the embodiment of the present invention.
Figure 15A:
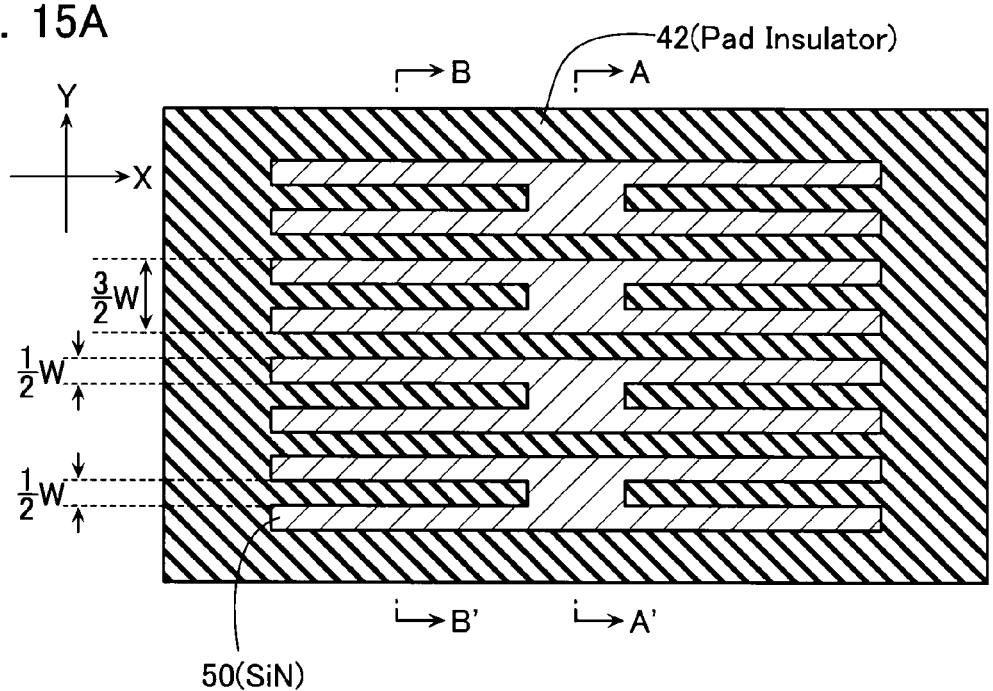
FIG. 15A shows a step in the method of manufacturing the semiconductor device according to the embodiment of the present invention.
Figure 15B:
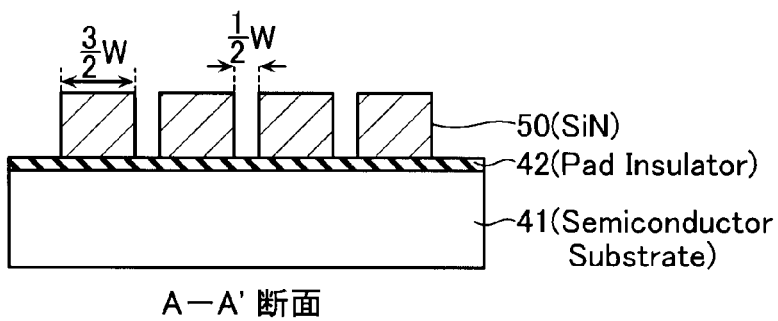
FIG. 15B shows a step in the method of manufacturing the semiconductor device according to the embodiment of the present invention.
Figure 15C:
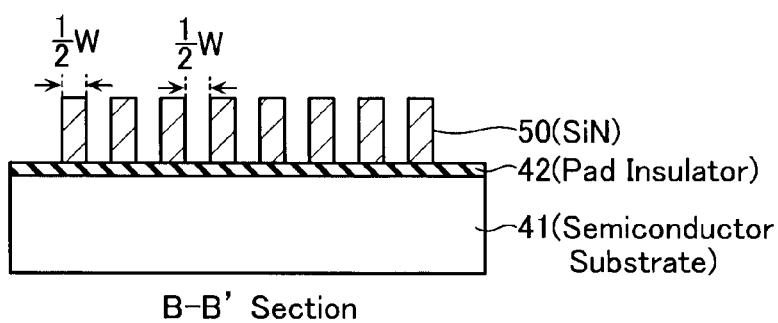
FIG. 15C shows a step in the method of manufacturing the semiconductor device according to the embodiment of the present invention.

The etching is further continued with a mask of the sidewall films 80 to etch the first hard mask 60 as shown in FIGS. 14A-14C. In this step, the silicon nitride 50 becomes a closed-loop form seen from above as shown in FIG. 14A. Subsequently, as shown in FIGS. 15A-15C, both ends of the silicon nitride 50 in the X-axis direction are lithographed and then etched off. As a result, the both ends of the silicon nitride 50 in the X-axis direction become in the form of lines as shown in FIG. 15A.

Figure 16A:
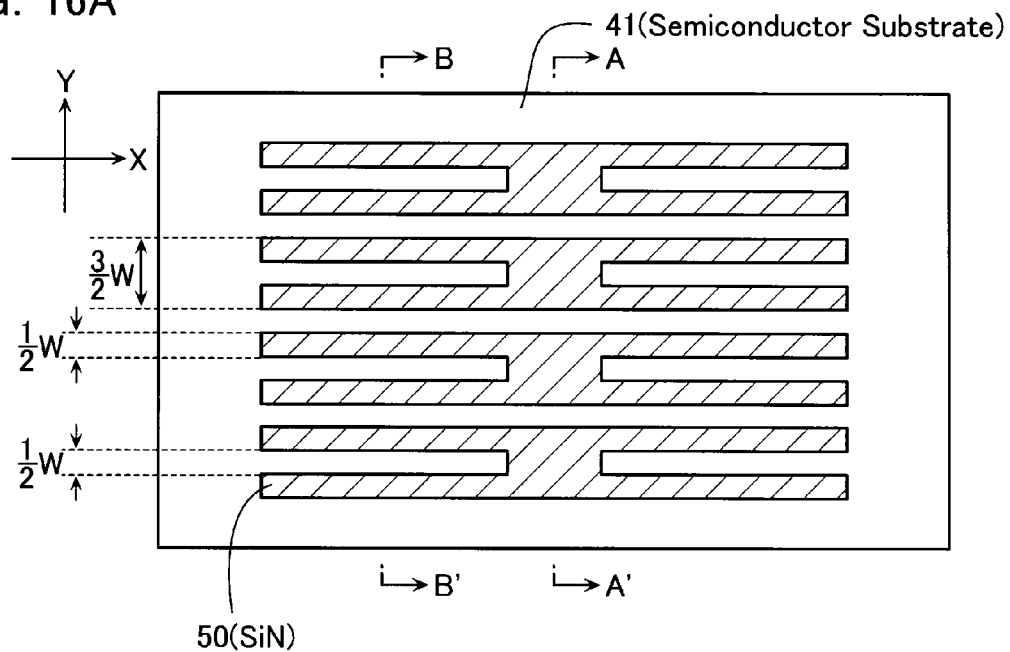
FIG. 16A shows a step in the method of manufacturing the semiconductor device according to the embodiment of the present invention.
Figure 16B:
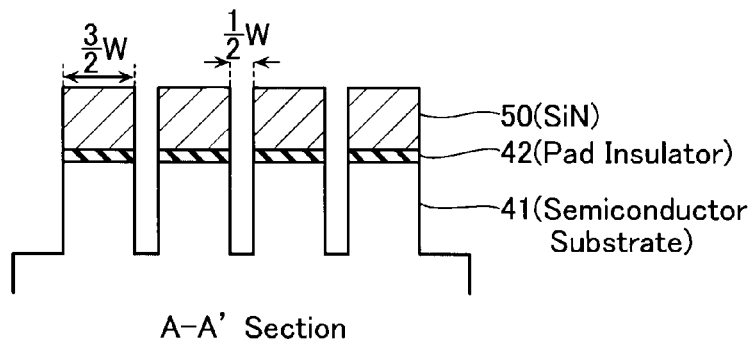
FIG. 16B shows a step in the method of manufacturing the semiconductor device according to the embodiment of the present invention.
Figure 16C:
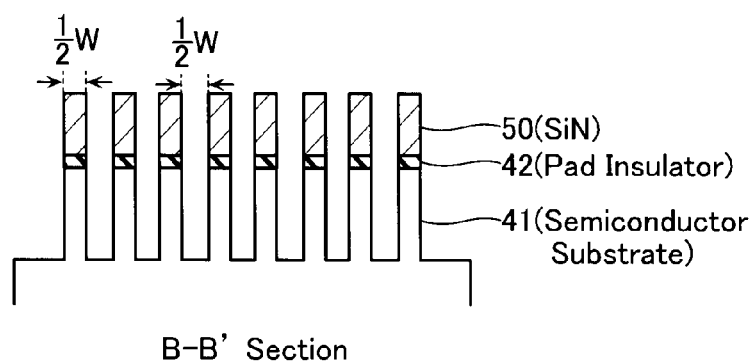
FIG. 16C shows a step in the method of manufacturing the semiconductor device according to the embodiment of the present invention.

Then, as shown in FIGS. 16A-16C, with a mask of the silicon nitride 50, the pad oxide 42 and the semiconductor substrate 41 in the underlying layers are etched. Through these steps, the H-shaped source/drain diffusion layer portions 1 each having the straight sections 11 and the connecting section 12 shown in FIG. 1 are finally formed in the underlying layer below the silicon nitride 50.

As described above, the method of manufacturing a semiconductor device according to the present embodiment includes forming plural paralleled linear portions of the second hard mask 70 on the first hard mask 60, and implanting ions of an impurity such as boron linearly as spanning the portions of the second hard mask 70 for reforming. Thus, the present embodiment is possible to form the straight sections 11 below the lithography solution limit and the connecting section 12 for connecting between the straight sections 11 in the source/drain diffusion layer 1 through an identical lithography step. Therefore, it is possible to reduce the difficulty of lithography particularly in comparison with the prior art.

Figure 17:
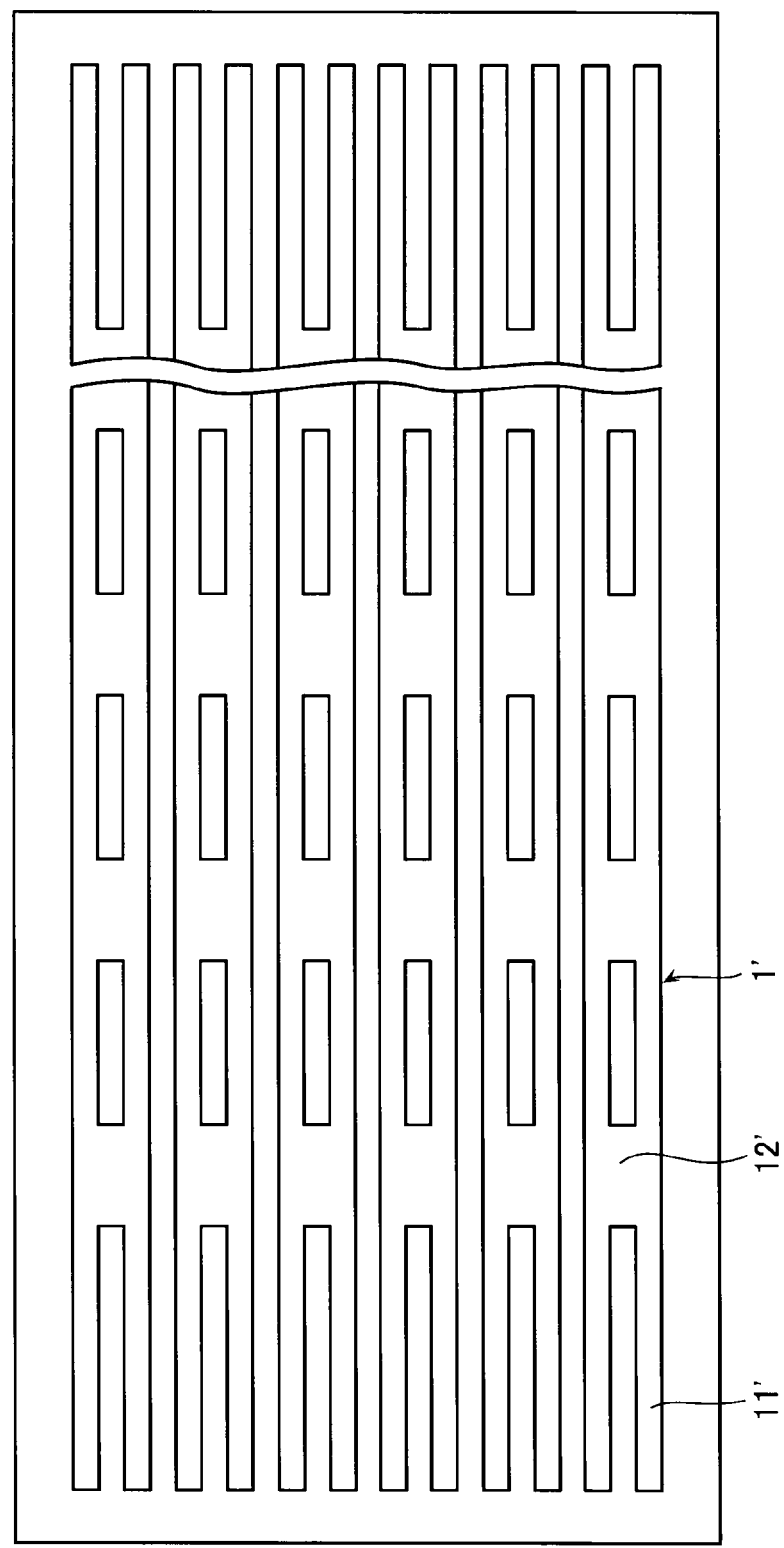
FIG. 17 shows a shape of source/drain diffusion layer portions 1' in a semiconductor device according to another embodiment of the present invention.

One embodiment of the invention has been described above though the present invention is not limited to this embodiment but rather can be given various modifications, additions and so forth without departing from the scope and spirit of the invention. For example, the sidewall film 80 is formed of amorphous silicon as exemplified in the above embodiment though, depending on the etching condition and others, it may be composed of other materials such as a silicon oxide or the like. The silicon nitride 50 is formed in an H-shape seen from above in the above embodiment though the silicon nitride 50 may be formed in a closed-loop as shown in FIG. 14A without the use of the step shown in FIGS. 15A-15C. The source/drain diffusion layer 1 is described as H-shaped in the above embodiment though the source/drain diffusion layer according to the present invention is not limited to the H-shape. In a word, a source/drain diffusion layer 1' as shown in FIG. 17 may also be available, which has straight sections 11' linearly extending in the X-axis direction, and connecting sections 12' for connecting between the straight sections 11' at plural locations in the X-axis direction.

What is claimed is:

1. A method of manufacturing a semiconductor device including a first region formed of a plurality of paralleled semiconductor layer portions extending linearly in a first direction and a second region formed of two adjacent ones of said semiconductor layer portions connected in a second direction, the method comprising:
   forming a first hard mask on an etching target member;
   forming on said first hard mask a second hard mask having paralleled portions extending straight in said first direction at plural locations;
   executing ion implantation into said second hard mask in said second region while protecting said second hard mask in said first region from said ion implantation with a mask, thereby changing an etching rate of said second hard mask in said second region for wet etching compared to that of said second hard mask in said first region;
   etching said first hard mask with a mask of said second hard mask;
   removing said second hard mask from said first region selectively by wet etching while leaving said second hard mask in said second region due to a difference in the etching rate;
   forming sidewall films on sidewalls of said first hard mask;
   etching off said first hard mask selectively to remove a portion thereof having an upper part not covered with said second hard mask but exposed in said first region; and
   etching off said etching target member with a mask of said sidewall films and said first hard mask.

2. The method of manufacturing according to claim 1, wherein said sidewall films are also formed on sidewalls of said second hard mask.

3. The method of manufacturing according to claim 1, wherein the step of executing ion implantation includes, after patterning said second hard mask, forming a mask in said first region other than said second region.

4. The method of manufacturing according to claim 1, wherein said first region and said second region are formed so as to configure an H-shaped form with said first region and said second region.

5. The method of manufacturing according to claim 1, wherein said first region and said second region are formed so as to configure a closed-loop form with said first region and said second region.

6. The method of manufacturing according to claim 1, wherein said first hard mask is composed of TEOS.

7. The method of manufacturing according to claim 1, further comprising forming said second hard mask with a line width of the minimum line width and a space width of said minimum line width, and then slimming said line width of said second hard mask.

8. The method of manufacturing according to claim 1, further comprising forming said second hard mask with a line width of ½ of the minimum line width and a space width of 3/2 of said minimum line width.

9. The method of manufacturing according to claim 1, wherein said second hard mask is composed of amorphous silicon or polysilicon.

10. The method of manufacturing according to claim 1, wherein said sidewall films are formed with a line width of ½ of the minimum line width.

11. The method of manufacturing according to claim 1, wherein said sidewall films are composed of amorphous silicon or silicon oxide.

12. The method of manufacturing according to claim 1, wherein ions for use in said ion implantation are of any one of boron, phosphorous, arsenic and boron difluoride.

* * * * *